(12) United States Patent
Delaney et al.

(10) Patent No.: US 11,194,544 B1
(45) Date of Patent: Dec. 7, 2021

(54) ADJUSTING SPEAKER VOLUME BASED ON A FUTURE NOISE EVENT

(71) Applicant: LENOVO (Singapore) PTE. LTD., New Tech Park (SG)

(72) Inventors: Mark Patrick Delaney, Raleigh, NC (US); John C. Mese, Cary, NC (US); Nathan J. Peterson, Oxford, NC (US); Russell Speight VanBlon, Raleigh, NC (US); Arnold S. Weksler, Raleigh, NC (US)

(73) Assignee: LENOVO (Singapore) PTE. LTD., New Tech Park (SG)

(*) Notice: Subject to any disclaimer, the term of this patent is extended or adjusted under 35 U.S.C. 154(b) by 0 days.

(21) Appl. No.: 16/951,831

(22) Filed: Nov. 18, 2020

(51) Int. Cl.
*G06F 3/16* (2006.01)
*H04R 3/00* (2006.01)

(52) U.S. Cl.
CPC ............... *G06F 3/165* (2013.01); *H04R 3/00* (2013.01); *H04R 2430/01* (2013.01)

(58) Field of Classification Search
CPC ........ G06F 3/165; H04R 3/00; H04R 2430/01
See application file for complete search history.

(56) References Cited

U.S. PATENT DOCUMENTS

| | | | |
|---|---|---|---|
| 9,905,215 B2* | 2/2018 | Liu | G10K 11/16 |
| 9,923,535 B2* | 3/2018 | Liu | H04R 3/04 |
| 10,290,292 B2* | 5/2019 | Liu | H04N 5/60 |
| 2008/0181419 A1* | 7/2008 | Goldstein | H04R 1/1083 |
| | | | 381/57 |
| 2011/0095875 A1* | 4/2011 | Thyssen | G09G 5/10 |
| | | | 340/407.1 |
| 2019/0088243 A1* | 3/2019 | Prasad | H04R 29/002 |
| 2021/0096811 A1* | 4/2021 | Giles | H04R 3/00 |

* cited by examiner

*Primary Examiner* — Joseph Saunders, Jr.
(74) *Attorney, Agent, or Firm* — Kunzler Bean & Adamson; Bruce R. Needham

(57) ABSTRACT

For adjusting speaker volume based on a future noise event, a method identifies, by a first electronic device, a future noise event. The method communicates the noise mitigation alert to a second electronic device. The method further adjusts, by the second electronic device, the speaker volume concurrent with the commencement of the future noise event.

20 Claims, 5 Drawing Sheets

200

| Future Noise Event |
| --- |
| 201 |
| Noise Mitigation Alert |
| 203 |
| Speaker Volume |
| 205 |
| Speaker Volume Adjustment |
| 207 |
| Source Device Distance |
| 209 |
| Source Device Location |
| 213 |
| Speaker Location |
| 215 |
| User Location |
| 217 |
| Noise Generation |
| 219 |
| Commencement Time |
| 221 |

| | Noise Mitigation Alert 203 | Source Device ID 211 | Speaker Volume Adj 207 | UVA 208 |
| --- | --- | --- | --- | --- |
| 202 | Noise Mitigation Alert 203 | Source Device ID 211 | Speaker Volume Adj 207 | UVA 208 |
| 202 | Noise Mitigation Alert 203 | Source Device ID 211 | Speaker Volume Adj 207 | UVA 208 |
| | ⋮ | | | |
| 202 | Noise Mitigation Alert 203 | Source Device ID 211 | Speaker Volume Adj 207 | UVA 208 |

| Source Device Distance 209 | Source Device Type 231 | Speaker Volume Adj 207 |
|---|---|---|
| Source Device Distance 209 | Source Device Type 231 | Speaker Volume Adj 207 |

204 marks each row.

⋮

| Source Device Distance 209 | Source Device Type 231 | Speaker Volume Adj 207 |

| Source Device ID 211 |
|---|
| Source Device Type 231 |
| Noise Generation 219 |
| Source Device Distance 209 |

FIG. 3B

ADJUSTING SPEAKER VOLUME BASED ON A FUTURE NOISE EVENT

FIELD

The subject matter disclosed herein relates to adjusting speaker volume and more particularly relates to adjusting speaker volume based on a future noise event.

BACKGROUND

Noise events may change the quality of listening to audio.

BRIEF SUMMARY

A method for adjusting speaker volume based on a future noise event is disclosed. The method identifies, by a first electronic device, a future noise event. The method communicates the noise mitigation alert to a second electronic device. The method further adjusts, by the second electronic device, the speaker volume concurrent with the commencement of the future noise event. An apparatus and program product also perform the functions of the method.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which:

FIG. 2A is a schematic block diagram illustrating one embodiment of noise event data;

FIG. 2B is a schematic block diagram illustrating one embodiment of an adjustment history;

FIG. 3A is a schematic block diagram illustrating one embodiment of shared data;

FIG. 3B is a schematic block diagram illustrating one embodiment of a noise mitigation alert;

DETAILED DESCRIPTION

Figure 1:
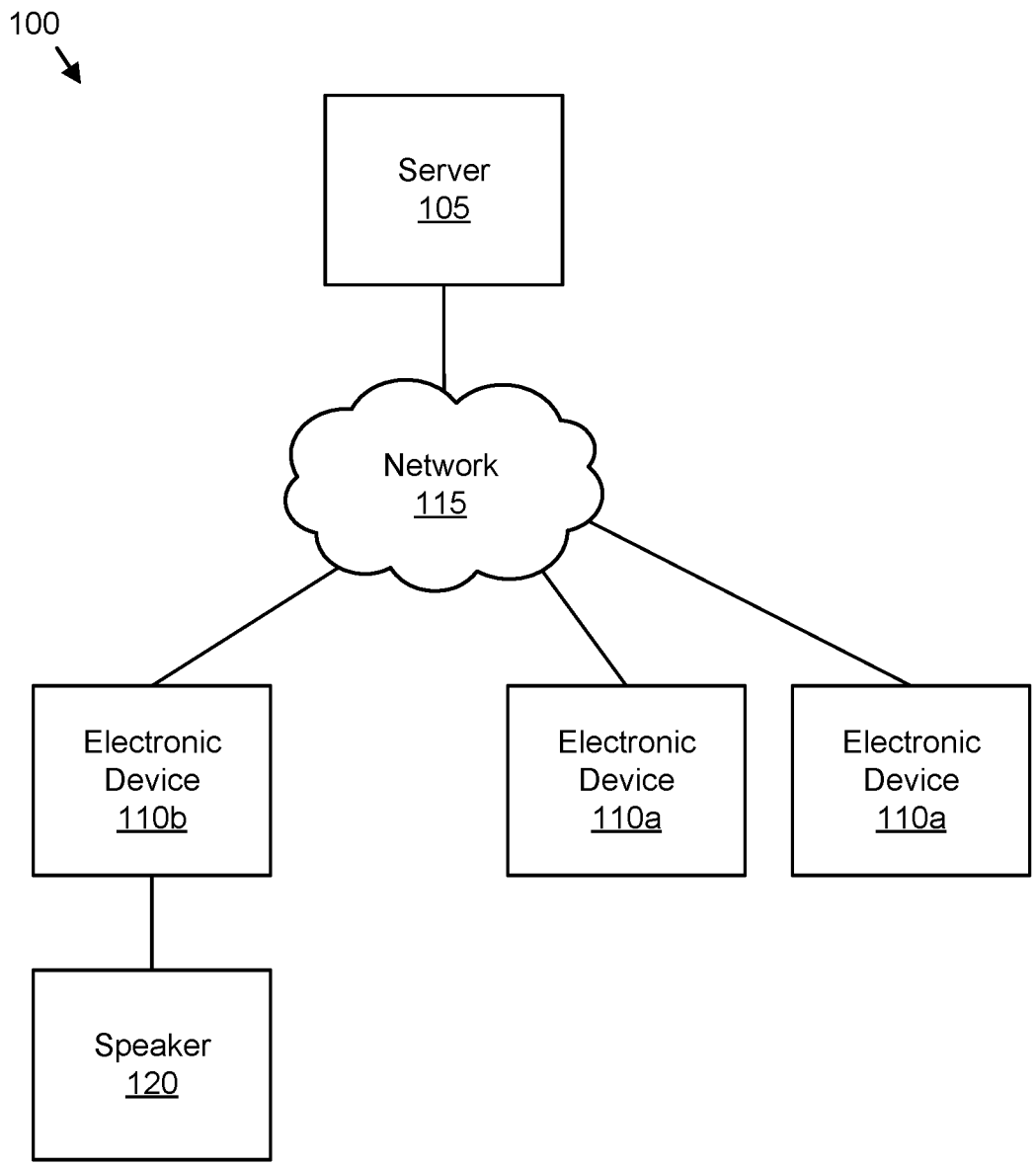
FIG. 1 is a schematic block diagram illustrating one embodiment of a noise event system.

As will be appreciated by one skilled in the art, aspects of the embodiments may be embodied as a system, method, or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Code for carrying out operations for embodiments may be written in any combination of one or more programming languages including an object oriented programming language such as Python, Ruby, R, Java, Java Script, Smalltalk, C++, C sharp, Lisp, Clojure, PHP, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The embodiments may transmit data between electronic devices. The embodiments may further convert the data from a first format to a second format, including converting the data from a non-standard format to a standard format and/or converting the data from the standard format to a non-standard format. The embodiments may modify, update, and/or process the data. The embodiments may store the received, converted, modified, updated, and/or processed data. The embodiments may provide remote access to the data including the updated data. The embodiments may make the data and/or updated data available in real time. The embodiments may generate and transmit a message based on the data and/or updated data in real time. The embodiments may securely communicate encrypted data. The embodiments may organize data for efficient validation. In addition, the embodiments may validate the data in response to an action and/or a lack of an action.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods, and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1 is a schematic block diagram illustrating one embodiment of a noise event system 100. The system 100 mitigates noise events. In the depicted embodiment, the system 100 includes a plurality of electronic devices 110. The electronic devices 110 communicate via a network 115. The network 115 may be the Internet, and Internet of things (IoT), a Bluetooth network, a mobile telephone network, a Wi-Fi network, a Bluetooth connection, or combinations thereof. In one embodiment, the system 100 includes a server 105 in communication with the network 115.

In one embodiment, a second electronic device 110*b* is presenting audio via a speaker 120. A user in the vicinity of the speaker may be listening to the audio. One or more first electronic devices 110*a* may identify a future noise event. The future noise event has not yet occurred, but the first electronic device 110*a* knows that the future noise event will occur.

In one embodiment, the future noise event will be caused by the first electronic device 110*a*. For example, the first electronic device 110*a* may be a washing machine electronic device 110*a*. The washing machine electronic device 110*a* may plan to start a spin cycle in five seconds, generating noise. The start of the spin cycle is one example of the future noise event. In an alternate embodiment, the future noise event will be caused a device in communication with the first electronic device 110*a*.

The embodiments identify the future noise event and communicate a noise mitigation alert to the second electronic device 110*b*. The embodiments further adjust a speaker volume concurrent with the commencement of the future noise event. As a result, the change in the speaker volume is synchronized with the commencement of the future noise event, improving the listening experience for the user.

Continuing the example above, the washing machine electronic device 110*a* may communicate a noise mitigation alert identifying the start of the spin cycle and the time the spin cycle will commence. As a result, the second electronic device 110*b* adjusts the speaker volume concurrent with the commencement of the spin cycle, so that the additional noise of the spin cycle is compensated for. Thus, the user does not miss dialogue or other aspects of the audio presented by the speaker 120.

FIG. 2A is a schematic block diagram illustrating one embodiment of noise event data 200. The noise event data 200 may store data for identifying the future noise event 201 and/or adjusting the speaker volume 205 in response to the future noise event 201. The noise event data 200 may be organized as a data structure in a memory. The noise event data 200 may be stored on the first electronic device 110*a*, the second electronic device 110*b*, the server 105, or combinations thereof. In the depicted embodiment, the noise event data 200 includes the future noise event 201, the noise mitigation alert 203, the speaker volume 205, a speaker volume adjustment 207, a source device distance 209, a source device location 213, a speaker location 215, a user location 217, a noise generation 219, and/or a commencement time 221.

The future noise event 201 identifies an increase or decrease in noise generation. The future noise event 201 may commence at the commencement time 221 in the future. The commencement time 221 may be an absolute time such as 16:32:25. In addition, the commencement time 221 may be a differential time such as five seconds in the future.

The noise mitigation alert 203 is described in more detail in FIG. 3B. The speaker volume 205 specifies the volume of the speaker 120. The speaker volume 205 may be a percentage between zero and 100 percent. In addition, the speaker volume 205 may be specified in decibels.

The speaker volume adjustment 207 may specify a change in the speaker volume 205 in order to mitigate the future noise event 201. The speaker volume adjustment 207 may be a percent change. In addition, the speaker volume adjustment 207 may be a change in decibels.

The source device distance 209 is a distance from a source of the future noise event 201 to the speaker 120, the user, or combinations thereof. The source of the future noise event 201 may be the first device 110*a*. In addition, the source of the future noise event 201 may be a device in communication with the first device 110*a*.

The source device location 213 records the location of the future noise event 201. The speaker location 215 records the location of the speaker 120. The user location 217 records the location of the user. The source device location 213, speaker location 215, and/or user location 217 may be used to calculate the source device distance 209.

The noise generation 219 may specify the noise generated for the future noise event 201. The noise generation 219 may be specified in decibels. The noise generation 219 may be an absolute noise generation 219 such as generating 40 decibels of noise. In addition, the noise generation 219 may include a change in noise generation 219 such as an increase of 20 decibels of noise. The noise generation 219 may be used to calculate the speaker volume adjustment 207.

FIG. 2B is a schematic block diagram illustrating one embodiment of an adjustment history 210. The adjustment history 210 may record speaker volume adjustments 207 from past noise mitigation alerts 203. The adjustment history 210 may be organized as a data structure in a memory. The adjustment history 210 may be stored on the first electronic device 110*a*, the second electronic device 110*b*, the server 105, or combinations thereof. In the depicted embodiment, the adjustment history includes a plurality of adjustment history entries 202.

In one embodiment, each adjustment history entry 202 includes a noise mitigation alert 203, a source device identifier 211, and the speaker volume adjustment 207. The source device identifier 211 may identify the source of the noise mitigation alert 203 such as the first electronic device 110*a*.

In a certain embodiment, each adjustment history entry 202 includes a user volume adjustment 208. The user volume adjustment 208 may record a change to the speaker volume 205 made by the user subsequent to the future noise event 201 and concurrent adjustment of the speaker volume 205 by the embodiments. For example, the user may feel that the speaker volume adjustment 207 was insufficient for the future noise event 201 and increased the speaker volume 205 by an additional 2 decibels, which is recorded as the user volume adjustment 208.

FIG. 3A is a schematic block diagram illustrating one embodiment of shared data 230. The shared data 230 may be used to determine a speaker volume adjustment 207 based on information from electronic devices 110 outside of the immediate environment of the system 100. For example, the shared data 230 may be used to estimate the speaker volume adjustment 207 for a dishwasher electronic device 110*a* in the user's environment based on speaker volume adjustments 207 for the same type of dishwasher electronic device 110*a* in other environments. The shared data 230 may be used to crowd source the speaker volume adjustment 207. The shared data 230 may be organized as a data structure in a memory. The shared data 230 may be stored on the first electronic device 110*a*, the second electronic device 110*b*, the server 105, or combinations thereof. In the depicted embodiment, the shared data 230 includes a plurality of shared data entries 204.

Each shared data entry 204 may include a source device distance 209, a source device type 231, and a speaker volume adjustment 207 for a future noise event 201 and/or noise mitigation alert 203. The source device type 231 may identify a type of a source first electronic device 110a or a source device in communication with the first electronic device 110a.

Continuing the example above, if a dishwasher electronic device 110a in another environment generated a noise mitigation alert 203 that resulted in a speaker volume adjustment 207, the source device distance 209, source device type 231, and resulting speaker volume adjustment 207 may be stored as a source data entry 204 in the shared data 230. Subsequently, a dishwasher electronic device 110a of the same source device type 231 in the user's environment may also generate a noise mitigation alert 203. The second electronic device 110b of the system 100 in the user's environment may access each source data entry 204 for the source device type 231 in order to determine the speaker volume adjustment 207.

FIG. 3B is a schematic block diagram illustrating one embodiment of the noise mitigation alert 203. The noise mitigation alert 203 may be communicated from a first electronic device 110a to the second electronic device 110b. The noise mitigation alert 203 may be organized as a data structure in a memory and/or one or more packets in a digital communication. In the depicted embodiment, the noise mitigation alert 203 includes the source device identifier 211, the source device type 231, the noise generation 219, and/or the source device distance 209.

Figure 4:
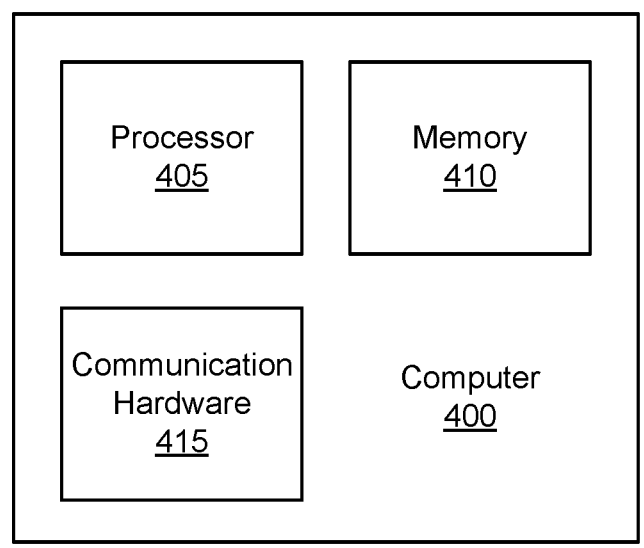
FIG. 4 is a schematic block diagram illustrating one embodiment of a computer.

FIG. 4 is a schematic block diagram illustrating one embodiment of a computer 400. The computer 400 may be embodied in the electronic devices 110 and/or the server 105. In the depicted embodiment, the computer 400 includes a processor 405, a memory 410, and communication hardware 415. The memory 410 may store code and data. The processor 405 may execute the code and process the data. The communication hardware 415 may communicate with other devices such as the network 115.

Figure 5:
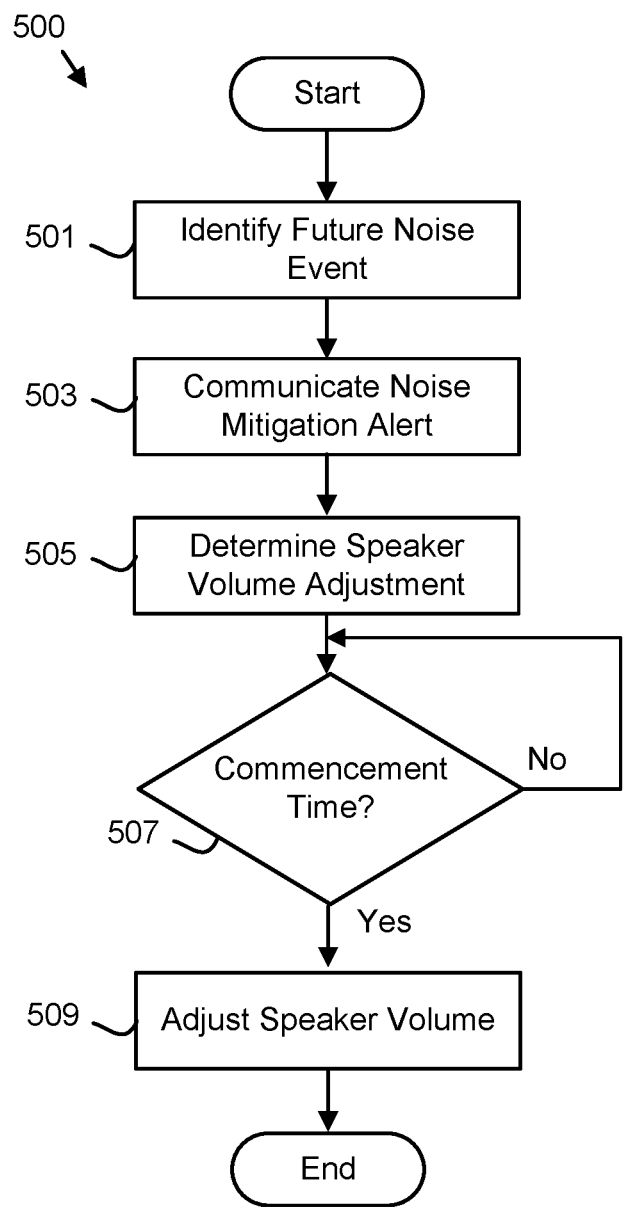
FIG. 5 is a schematic flow chart diagram illustrating one embodiment of a speaker volume adjustment method.

FIG. 5 is a schematic flow chart diagram illustrating one embodiment of a speaker volume adjustment method 500. The method 500 may adjust the speaker volume 205 in response to the future noise event 201. Method 500 may be performed by the noise event system 100 and/or one or more processors 405.

The method 500 starts, and in one embodiment, the processor 405 of the first electronic device 110a identifies 501 the future noise event 201. The future noise event 201 may be an increase in noise generation 219 by the first electronic device 110a and/or device in communication with the first electronic device 110a. In addition, the future noise event 201 may be a decrease in noise generation 219 by the first electronic device 110a and/or a device in communication with the first electronic device 110a. For example, an air-conditioner first electronic device 110a may determine to begin cooling in two seconds, causing noise generation 219 from a compressor.

The first electronic device 110a may communicate 503 the noise mitigation alert 203 to the second electronic device 110b. The noise mitigation alert 203 may include at least one of the source device identifier 211, the source device type 231, the noise generation 219, and the source device distance 201.

The processor 405 of the second electronic device 110b determines 505 a speaker volume 205 and/or speaker volume adjustment 207 for the speaker 120. The speaker volume 205 will be employed concurrent with the commencement of the future noise event 201. The speaker volume 205 may be increased in response to an increase in noise generation 219. In addition, the speaker volume 205 may be decreased in response to a decreasing noise generation 219.

The speaker volume adjustment 207 may be based on the source device distance 209 from the user to the source device location 213. Alternatively, the speaker volume adjustment 207 may be based on the source device distance 209 from the speaker 120 to the source device location 213.

In one embodiment, the speaker volume adjustment SVA 207 is calculated using Equation 1, wherein NG is the change in noise generation 219, d is the source device distance 209, and k is a nonzero constant.

$$SVA = kNG/d^2 \qquad \text{Equation 1}$$

In one embodiment, the speaker volume adjustment 207 is based on the shared data 230 that is shared between a plurality of electronic devices 110. For example, the second electronic device 110b may receive a plurality of shared data entries 204. The second electronic device 110b further identifies shared data entries 204 with the source device type 231 that is equivalent to the source device type 231 from the noise mitigation alert 203. The speaker volume adjustment 207 may be calculated as a function of the source device distances 209 and the speaker volume adjustments 207 for the matching share data entries 204. In one embodiment, a second-order curve is calculated for the speaker volume adjustments 207 as a function of the source device distances 209. The second-order curve may be used to determine the speaker volume adjustment 207 for the speaker 120 based on the source device distance 209.

In one embodiment, the speaker volume adjustment 207 is based on the adjustment history 210 of previous noise mitigation alerts 203. The previous noise mitigation alerts 203 may be received from adjustment history entries 202 with source device identifiers 211 that match the source device identifier 211 of the first electronic device 110a that communicated the current noise mitigation alert 203.

In a certain embodiment, the speaker volume adjustment 207 is set equal to the speaker volume adjustment 207 of the most recently received adjustment history entry 202. In an alternative embodiment, the speaker volume adjustment 207 is calculated as an average speaker volume adjustment 207 for the matching adjustment history entries 202.

The speaker volume adjustment 207 may be set equal to the speaker volume adjustment 207 of the most recently received adjustment history entry 202 plus the user volume adjustment 208 of the most recently received adjustment history entry 202.

In one embodiment, the speaker volume adjustment 207 is based on the speaker volume adjustments 207 for a plurality of noise mitigation alerts 203. The plurality of noise mitigation alerts 203 may match the source device identifier 211 of the first electronic device 110a. For example, the noise generation 219 of the noise mitigation alerts 203 may be averaged and the speaker volume adjustment 207 calculated using Equation 1 based on the average noise generation 219.

The speaker volume adjustment 207 may be based on the speaker volume adjustments 207 and the user volume adjustments 208 for the plurality of noise mitigation alerts 203. For example, the speaker volume adjustment 207 and user volume adjustment 208 for each noise mitigation alert 203 may be summed, and the average of sum determined 505 as the speaker volume adjustment 208.

The second electronic device 110b may determine 507 if the commencement time 221 for the future noise event 201 has arrived. If the commencement time 221 has not arrived, the second electronic device 110b continues to wait for the commencement time 221.

If the commencement time 221 is arrived, the second electronic device 110b adjusts 509 the speaker volume 205 concurrent with the commencement of the future noise event 201 and the method 500 ends. In one embodiment, the speaker volume 205 is adjusted 509 at the commencement time 221.

The embodiments identify future noise event 201. The future noise event 201 has not occurred but is planned to occur in the future. The embodiments further communicate the noise mitigation alert 203 to the second electronic device 110b. The second electronic device 110b adjusts the speaker volume 205 concurrent with the commencement of the future noise event 201. As a result, the speaker volume 205 is seamlessly adjusted with the commencement of the future noise event 201, improving the listening experience of the user and increasing the efficiency of the second electronic device 110b.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
    identifying, by a first electronic device, a future noise event to be generated by the first electronic device;
    communicating, in response to identification of the future noise event, a noise mitigation alert to a second electronic device, the noise mitigation alert comprising an indicator of an expected noise level of the noise event; and
    adjusting, by the second electronic device, a speaker volume concurrent with a commencement of the future noise event, the speaker volume adjusted by an amount corresponding to the expected noise level of the noise event.

2. The method of claim 1, wherein the future noise event is an increase in noise generation and the speaker volume is increased.

3. The method of claim 1, wherein the future noise event is a decrease in noise generation and the speaker volume is decreased.

4. The method of claim 1, wherein a speaker volume adjustment is based on shared data that is shared between a plurality of electronic devices.

5. The method of claim 1, wherein a speaker volume adjustment is based on an adjustment history of previous noise mitigation alerts.

6. The method of claim 1, wherein a speaker volume adjustment is based on a source device distance from a speaker and/or user to the first electronic device.

7. The method of claim 1, wherein a speaker volume adjustment is based on speaker volume adjustments for a plurality of noise mitigation alerts.

8. An apparatus comprising:
    a processor;
    a memory storing code executable by the processor to:
        identify, by a first electronic device, a future noise event to be generated by the first electronic device;
        communicate, in response to identification of the noise event, a noise mitigation alert to a second electronic device, the noise mitigation alert comprising an indicator of an expected noise level of the noise event; and
        adjust, by the second electronic device, a speaker volume concurrent with a commencement of the future noise event, the speaker volume adjusted by an amount corresponding to the expected noise level of the noise event.

9. The apparatus of claim 8, wherein the future noise event is an increase in noise generation and the speaker volume is increased.

10. The apparatus of claim 8, wherein the future noise event is a decrease in noise generation and the speaker volume is decreased.

11. The apparatus of claim 8, wherein a speaker volume adjustment is based on shared data that is shared between a plurality of electronic devices.

12. The apparatus of claim 8, wherein a speaker volume adjustment is based on an adjustment history of previous noise mitigation alerts.

13. The apparatus of claim 8, wherein a speaker volume adjustment is based on a source device distance from a speaker and/or user to the first electronic device.

14. The apparatus of claim 8, wherein a speaker volume adjustment is based on speaker volume adjustments for a plurality of noise mitigation alerts.

15. A program product comprising a non-transitory computer readable storage medium that stores code executable by a processor, the executable code comprising code to:
    identify, by a first electronic device, a future noise event to be generated by the first electronic device;
    communicate, in response to identification of the noise event, a noise mitigation alert to a second electronic device, the noise mitigation alert comprising an indicator of an expected noise level of the noise event; and
    adjust, by the second electronic device, a speaker volume concurrent with a commencement of the future noise event, the speaker volume adjusted by an amount corresponding to the expected noise level of the noise event.

16. The program product of claim 15, wherein the future noise event is an increase in noise generation and the speaker volume is increased.

17. The program product of claim 15, wherein the future noise event is a decrease in noise generation and the speaker volume is decreased.

18. The program product of claim 15, wherein a speaker volume adjustment is based on shared data that is shared between a plurality of electronic devices.

19. The program product of claim 15, wherein a speaker volume adjustment is based on an adjustment history of previous noise mitigation alerts.

20. The program product of claim 15, wherein a speaker volume adjustment is based on a source device distance from a speaker and/or user to the first electronic device.

* * * * *